(12) United States Patent
Suzuki et al.

(10) Patent No.: US 9,096,471 B2
(45) Date of Patent: Aug. 4, 2015

(54) METHOD FOR PRODUCING A LAYERED MATERIAL

(75) Inventors: Daisuke Suzuki, Oyama (JP); Shigeru Oyama, Oyama (JP); Atsushi Otaki, Oyama (JP)

(73) Assignee: Showa Denko K.K., Tokyo (JP)

( * ) Notice: Subject to any disclaimer, the term of this patent is extended or adjusted under 35 U.S.C. 154(b) by 290 days.

(21) Appl. No.: 13/511,261

(22) PCT Filed: Nov. 26, 2010

(86) PCT No.: PCT/JP2010/071082
§ 371 (c)(1),
(2), (4) Date: May 22, 2012

(87) PCT Pub. No.: WO2011/065457
PCT Pub. Date: Jun. 3, 2011

(65) Prior Publication Data
US 2013/0004791 A1    Jan. 3, 2013

(30) Foreign Application Priority Data
Nov. 27, 2009  (JP) ................. 2009-269787

(51) Int. Cl.
*C04B 37/02*    (2006.01)
*B23K 11/16*    (2006.01)
*H01L 23/373*   (2006.01)

(52) U.S. Cl.
CPC .......... *C04B 37/021* (2013.01); *H01L 23/3735* (2013.01); *C04B 2235/666* (2013.01);
(Continued)

(58) Field of Classification Search
CPC ............ C04B 37/021; C04B 2235/666; C04B 2235/963; C04B 2235/9638; C04B 2237/408; C04B 2237/52; B23K 11/16; H01L 23/3735
USPC ........................................ 219/50, 78.01, 118
See application file for complete search history.

(56) References Cited

U.S. PATENT DOCUMENTS 3,256,598 A * 6/1966 Burrows et al. ............... 219/118
5,935,722 A * 8/1999 Moorhead et al. ......... 428/846.2
(Continued)

FOREIGN PATENT DOCUMENTS

JP    1-119571 A  *  5/1989
JP    4-238876 A  *  8/1992
(Continued)

OTHER PUBLICATIONS

Machine translation of Japan patent document No. 10-65,222, Aug. 2014.*
(Continued)

*Primary Examiner* — Geoffrey S Evans
(74) *Attorney, Agent, or Firm* — Locke Lord LLP; James E. Armstrong, IV

(57) ABSTRACT

A layered material 1 includes two metal sheets 2,3 and one ceramic sheet 4, wherein the metal sheets 2,3 and the ceramic sheet 4 are stacked so that the ceramic sheet 4 is disposed between the two metal sheets 2,3, and then bonded together through spark plasma sintering. The difference in melting temperature between the metal sheets 2 and 3 is 140° C. or less. The layered material 1 is produced by stacking two metallic sheets 2,3 that have a difference in melting temperature of 140° C. or less and the ceramic sheet 4 so that the ceramic sheet 4 is placed between the both metal sheets 2,3, then disposing the stacked structure of the metal sheet 2,3 and the ceramic sheet 4 between a pair of electrodes in a spark plasma sintering device, and bonding the metal sheets 2,3 and the ceramic sheet 4 by applying a pulse current between the electrodes while maintaining the conduction between the electrodes.

14 Claims, 9 Drawing Sheets

(52) U.S. Cl.
CPC ....... *C04B2235/963* (2013.01); *C04B 2237/34* (2013.01); *C04B 2237/343* (2013.01); *C04B 2237/361* (2013.01); *C04B 2237/365* (2013.01); *C04B 2237/366* (2013.01); *C04B 2237/368* (2013.01); *C04B 2237/402* (2013.01); *C04B 2237/403* (2013.01); *C04B 2237/405* (2013.01); *C04B 2237/407* (2013.01); *C04B 2237/408* (2013.01); *C04B 2237/52* (2013.01); *H01L 2924/0002* (2013.01); *Y10T 428/12535* (2015.01)

(56) References Cited

U.S. PATENT DOCUMENTS

| | | | | |
|---|---|---|---|---|
| 2002/0011468 | A1* | 1/2002 | Miyasaka et al. | 219/78.02 |
| 2003/0062399 | A1* | 4/2003 | Kimura et al. | 228/122.1 |
| 2004/0262367 | A1* | 12/2004 | Nakamura | 228/122.1 |
| 2006/0243368 | A1* | 11/2006 | Stowell et al. | 156/89.11 |
| 2007/0178300 | A1* | 8/2007 | Amla et al. | 428/332 |
| 2008/0190542 | A1* | 8/2008 | Tuan | 156/60 |
| 2008/0257472 | A1* | 10/2008 | Asano | 156/47 |
| 2009/0072700 | A1* | 3/2009 | Kameshima et al. | 313/483 |
| 2009/0286382 | A1* | 11/2009 | Huff | 438/455 |
| 2010/0139840 | A1* | 6/2010 | Allemand et al. | 156/89.11 |
| 2011/0005810 | A1* | 1/2011 | Uneno et al. | 264/619 |
| 2012/0100381 | A1* | 4/2012 | Chang et al. | 228/122.1 |
| 2012/0141823 | A1* | 6/2012 | Chang et al. | 219/121.46 |
| 2012/0141824 | A1* | 6/2012 | Chang et al. | 219/108 |
| 2012/0279850 | A1* | 11/2012 | Patoux et al. | 204/164 |

FOREIGN PATENT DOCUMENTS

| | | | |
|---|---|---|---|
| JP | 05-055640 | A | 3/1993 |
| JP | 10-065222 | A * | 3/1998 |
| JP | 10-074986 | A | 3/1998 |
| JP | 2001-089258 | A * | 4/2001 |
| JP | 2001-329302 | A | 11/2001 |
| JP | 2002-035955 | A | 2/2002 |
| JP | 2002-118300 | A | 4/2002 |
| JP | 2003-124410 | A | 4/2003 |
| JP | 2005-026252 | A | 1/2005 |
| JP | 2006-232579 | A | 9/2006 |
| JP | 2007-116111 | A | 5/2007 |
| JP | 2007-294689 | A | 11/2007 |
| JP | 2009-170438 | A | 7/2009 |
| WO | WO-2009119438 | A1 | 10/2009 |

OTHER PUBLICATIONS

Machine translation of Japan patent document No. 2001-89,258, Aug. 2014.*

Couret et al., "Microstructures and mechanical properties of TiAl alloys consolidated by spark plasma sintering", Aug. 2008, Intermetallics, vol. 16, pp. 1134-1141.*

International Search Report dated Mar. 22, 2011, issued for PCT/JP2010/071082.

Official Letter dated Dec. 27, 2013 from the State Intellectual Property Office of PRC in the corresponding Chinese patent application No. 201080043835.5.

* cited by examiner

METHOD FOR PRODUCING A LAYERED MATERIAL

TECHNICAL FIELD

The present invention relates to a layered material and to a method for producing the layered material. More particularly, the present invention relates to a layered material which is used for cooling of a semiconductor device such as an LED or a power device, and to a method for producing the layered material.

In the present specification and appended claims, a material represented by an element symbol or a combination of element symbols refers to an absolutely pure material, and also to a substantially pure industrial material containing unavoidable impurities.

As used in the present specification and appended claims, the term "spark plasma sintering" is not limited to the method of actually sintering powder, and refers to a method utilizing the principle of spark plasma sintering.

As used in the present specification and appended claims, the term "melting point" of an alloy refers to the solidus temperature of the alloy.

BACKGROUND ART

The present applicant previously proposed, for example, a layered material including a ceramic layer and a metal layer. Specifically, the present applicant proposed a layered material including a ceramic sheet formed of a spark plasma sintered compact of ceramic powder, and metal layers provided on both surfaces of the ceramic sheet, each of the metal layers being formed of a spark plasma sintered compact of metal powder, which layered material is produced through a method in which the metal layers are formed, through spark plasma sintering of metal powder, on both surfaces of the ceramic sheet which has been formed in advance (see Patent Document 1).

However, in the case of the layered material described in Patent Document 1, since the metal layers are formed, through spark plasma sintering of metal powder, on both surfaces of the ceramic sheet which has been formed in advance, reduction in volume of the metal powder during spark plasma sintering must be considered, and productivity may be reduced in consideration of improvement of the dimensional accuracy of the metal layers in a thickness direction. In addition, both surfaces of the thus-produced layered material may exhibit poor flatness, due to reduction in volume of the metal powder during spark plasma sintering. In such a case, the layered material requires finishing treatment through a sizing process (e.g., polishing).

PRIOR ART DOCUMENT

Patent Document

Patent Document 1: International Publication WO 2009/119438 pamphlet

SUMMARY OF THE INVENTION

Problems to be Solved by the Invention

In order to solve the aforementioned problems, an object of the present invention is to provide a layered material exhibiting excellent productivity and improved flatness, as compared with the layered material described in Patent Document 1. Another object of the present invention is to provide a method for producing the layered material of the invention.

Means for Solving the Problems

In order to achieve the aforementioned objects, the present invention provides the following.

1) A layered material comprising a plurality of metal sheets and at least one ceramic sheet, wherein the metal sheets and the ceramic sheet are stacked together such that the ceramic sheet is adjacent to each of the metal sheets; the ceramic sheet is bonded to the adjacent metal sheets through spark plasma sintering; and the difference in melting temperature between the metal sheets adjacent to the ceramic sheet is 140° C. or less.

2) A layered material according to 1) above, wherein two metal sheets and one ceramic sheet are stacked together such that the ceramic sheet is disposed between the two metal sheets, and the difference between the melting temperature of one of the metal sheets and that of the other metal sheet is 140° C. or less.

3) A layered material according to 2) above, wherein an additional metal sheet made of a material which does not melt at the heating temperature during spark plasma sintering is stacked and bonded, through spark plasma sintering, to the surface of at least one of the two metal sheets on the side opposite the surface bonded to the ceramic sheet.

4) A layered material comprising one metal sheet and one or two ceramic sheets, wherein the metal sheet and the ceramic sheet(s) are stacked together such that the metal sheet is adjacent to the ceramic sheet(s), and the metal sheet is bonded to the adjacent ceramic sheet(s) through spark plasma sintering.

5) A layered material according to 4) above, which is formed of one metal sheet and one ceramic sheet, wherein an additional metal sheet made of a material which does not melt at the heating temperature during spark plasma sintering is stacked and bonded, through spark plasma sintering, to the surface of the metal sheet on the side opposite the surface bonded to the ceramic sheet.

6) A layered material according to 1) or 4) above, wherein the metal sheet(s) is(are) formed of one material selected from the group consisting of Al, Cu, Ag, Au, Ni, Ti, an Al alloy, a Cu alloy, an Ag alloy, an Au alloy, an Ni alloy, and a Ti alloy.

7) A layered material according to 1) or 4) above, wherein the ceramic sheet(s) is(are) formed of one material selected from the group consisting of AlN, $Al_2O_3$, $Si_3N_4$, SiC, $Y_2O_3$, CaO, BN, and BeO.

8) A layered material according to 1) or 4) above, wherein both the top and bottom surfaces have a flatness of 100 μm or less.

9) A method for producing a layered material as recited in 1) above, the layered material comprising a plurality of metal sheets and at least one ceramic sheet, wherein the metal sheets and the ceramic sheet are stacked together such that the ceramic sheet is adjacent to each of the metal sheets, and the ceramic sheet is bonded to the adjacent metal sheets through spark plasma sintering, which method is characterized by comprising:

stacking a plurality of metal sheets and at least one ceramic sheet together so that the ceramic sheet is adjacent to each of the metal sheets, the difference in melting temperature between the metal sheets adjacent to the ceramic sheet being 140° C. or less;

disposing the stacked product of the metal sheets and the ceramic sheet between a pair of electrodes for spark plasma sintering; and applying pulse current between the electrodes while securing electrical conduction between the electrodes, to thereby bond the ceramic sheet to the metal sheets adjacent thereto.

10) A method for producing a layered material according to 9) above, wherein bonding the ceramic sheet to the metal sheets adjacent thereto by applying pulse current between the electrodes while securing electrical conduction between the electrodes is carried out through heating at a temperature between the temperature lower by 150° C. than the melting temperature of the highest-melting-temperature metal sheet of the metal sheets whose difference in melting temperature is 140° C. or less, and the temperature lower by 10° C. than the melting temperature of the lowest-melting-temperature metal sheet of the metal sheets.

11) A method for producing a layered material according to 10) above, wherein two metal sheets whose difference in melting temperature is 140° C. or less are stacked on both surfaces of one ceramic sheet so that the ceramic sheet is adjacent to each of the metal sheets; at least one additional metal sheet made of a material which does not melt at the heating temperature during spark plasma sintering is stacked on the surface of at least one of the two metal sheets on the side opposite the surface which is in contact with the ceramic sheet; and the two metal sheets are bonded to both surfaces of the ceramic sheet, while the additional metal sheet made of a material which does not melt at the heating temperature during spark plasma sintering is bonded to the surface of at least one of the two metal sheets on the side opposite the surface bonded to the ceramic sheet.

12) A method for producing a layered material as recited in 4) above, the layered material comprising one metal sheet and one or two ceramic sheets, wherein the metal sheet and the ceramic sheet(s) are stacked together such that the metal sheet is adjacent to the ceramic sheet(s), and the metal sheet is bonded to the adjacent ceramic sheet(s) through spark plasma sintering, which method is characterized by comprising:

stacking one metal sheet and one or two ceramic sheets together so that the metal sheet is adjacent to the ceramic sheet(s);

disposing the stacked product of the metal sheet and the ceramic sheet(s) between a pair of electrodes for spark plasma sintering; and applying pulse current between the electrodes while securing electrical conduction between the electrodes, to thereby bond the metal sheet to the ceramic sheet(s) adjacent thereto.

13) A method for producing a layered material according to 12) above, wherein bonding the metal sheet to the ceramic sheet(s) by applying pulse current between the electrodes is carried out through heating at a temperature lower by 10 to 150° C. than the melting temperature of the metal sheet.

14) A method for producing a layered material according to 13) above, wherein one metal sheet is stacked on one surface of one ceramic sheet; an additional metal sheet made of a material which does not melt at the heating temperature during spark plasma sintering is stacked on the surface of the metal sheet on the side opposite the surface which is in contact with the ceramic sheet; and the metal sheet is bonded to one surface of the ceramic sheet, while the additional metal sheet made of a material which does not melt at the heating temperature during spark plasma sintering is bonded to the surface of the metal sheet on the side opposite the surface bonded to the ceramic sheet.

15) A method for producing a layered material according to 9) or 12) above, wherein the metal sheet(s) is(are) formed of one material selected from the group consisting of Al, Cu, Ag, Au, Ni, Ti, an Al alloy, a Cu alloy, an Ag alloy, an Au alloy, an Ni alloy, and a Ti alloy.

16) A method for producing a layered material according to 9) or 12) above, wherein the ceramic sheet(s) is(are) formed of one material selected from the group consisting of AlN, $Al_2O_3$, $Si_3N_4$, SiC, $Y_2O_3$, CaO, BN, and BeO.

17) A method for producing a layered material according to 9) or 12) above, wherein the arithmetic mean surface roughness (Ra) of the metal sheet(s) is 1.0 µm or less.

18) A method for producing a layered material according to 9) or 12) above, wherein the arithmetic mean surface roughness (Ra) of the ceramic sheet(s) is 1.5 µm or less.

19) A method for producing a layered material according to 9) or 12) above, wherein bonding between the metal sheet(s) and the ceramic sheet(s) by applying pulse current between the electrodes is carried out through application of a pressure of 10 to 100 MPa to both sides of the stacked product of the metal sheet(s) and the ceramic sheet(s) in a stacking direction.

20) A method for producing a layered material according to 9) or 12) above, wherein bonding between the metal sheet(s) and the ceramic sheet(s) by applying pulse current between the electrodes is carried out in an inert gas or vacuum atmosphere.

Effects of the Invention

In the layered material of any of 1) to 3) and 6) to 8) above, a plurality of metal sheets and at least one ceramic sheet are stacked together such that the ceramic sheet is adjacent to each of the metal sheets, and the ceramic sheet is bonded to the adjacent metal sheets through spark plasma sintering. Thus, the metal sheets which have been formed in advance undergo less dimensional change upon production of the layered material, and the dimensional accuracy of the metal sheets in a thickness direction can be relatively readily improved. Therefore, the layered material exhibits excellent productivity, as compared with that described in Patent Document 1. Furthermore, the flatness of both the top and bottom surfaces of the layered material can be reduced to, for example, 100 µm or less. Thus, both the top and bottom surfaces of the layered material exhibit improved flatness, as compared with the case of that described in Patent Document 1, and the layered material does not require finishing treatment through a sizing process (e.g., polishing).

Since the difference in melting temperature between the metal sheets adjacent to the ceramic sheet is 140° C. or less, the ceramic sheet can be reliably bonded to the metal sheets adjacent thereto through a single spark plasma sintering process, and deformation of the metal sheet having a lower melting temperature due to, for example, partial melting can be prevented during spark plasma sintering.

In the layered material of 2) above, when the two metal sheets are formed of one material selected from the group consisting of Al, Cu, Ag, Au, an Al alloy, a Cu alloy, an Ag alloy, and an Au alloy, and the ceramic sheet is formed of one material selected from the group consisting of AlN, $Al_2O_3$, $Si_3N_4$, SiC, $Y_2O_3$, CaO, BN, and BeO, one of the metal sheets can be employed as a wiring layer, and the ceramic sheet can be employed as an electrically insulating layer. Therefore, when a stress relaxation member is bonded through, for example, brazing to the surface of the other metal sheet on the side opposite the surface bonded to the ceramic sheet, and the stress relaxation member is bonded through brazing to a heat radiation material (e.g., heat sink) formed of a highly thermally conductive material such as Al, an Al alloy, Cu, or a Cu alloy, a power module base is produced. When a power device is mounted on the wiring layer of the power module base, a power module is produced. Since only the two metal sheets, the one ceramic sheet, and the stress relaxation member are present between the power device and the heat radiation material, the thermal conduction pathway from the power device to the heat radiation material is shortened, and the radiation performance of heat generated from the power device is improved. Since a brazing material having low thermal conductivity is not required to be provided between the two metal sheets and the ceramic sheet, excellent thermal conduction is achieved between the metal sheets and the ceramic sheet.

In the layered material of any of 4) to 8) above, one metal sheet and one or two ceramic sheets are stacked together such that the metal sheet is adjacent to the ceramic sheet(s), and the metal sheet is bonded to the adjacent ceramic sheet(s) through spark plasma sintering. Thus, the metal sheet which has been formed in advance undergoes less dimensional change upon production of the layered material, and the dimensional accuracy of the metal sheet in a thickness direction can be relatively readily improved. Therefore, the layered material exhibits excellent productivity, as compared with that described in Patent Document 1. Furthermore, the flatness of both the top and bottom surfaces of the layered material can be reduced to, for example, 100 µm or less. Thus, both the top and bottom surfaces of the layered material exhibit improved flatness, as compared with the case of that described in Patent Document 1, and the layered material does not require finishing treatment through a sizing process (e.g., polishing).

When the layered material of 4) above includes one metal sheet and one ceramic sheet; the metal sheet is formed of one material selected from the group consisting of Al, Cu, Ag, Au, an Al alloy, a Cu alloy, an Ag alloy, and an Au alloy; and the ceramic sheet is formed of one material selected from the group consisting of AlN, $Al_2O_3$, $Si_3N_4$, SiC, $Y_2O_3$, CaO, BN, and BeO, the metal sheet can be employed as a wiring layer, and the ceramic sheet can be employed as an electrically insulating layer. Therefore, when a stress relaxation member is bonded through, for example, brazing to the surface of the ceramic sheet on the side opposite the surface bonded to the metal sheet, and the stress relaxation member is bonded through brazing to a heat radiation material (e.g., heat sink) formed of a highly thermally conductive material such as Al, an Al alloy, Cu, or a Cu alloy, a power module base is produced. When a power device is mounted on the wiring layer of the power module base, a power module is produced. Since only the one metal sheet, the one ceramic sheet, and the stress relaxation member are present between the power device and the heat radiation material, the thermal conduction pathway from the power device to the heat radiation material is shortened, and the radiation performance of heat generated from the power device is improved. Since a brazing material having low thermal conductivity is not required to be provided between the metal sheet and the ceramic sheet, excellent thermal conduction is achieved between the metal sheet and the ceramic sheet.

According to the layered material production method of any of 9) to 11) above, the layered material of 1) above can be readily produced.

According to the layered material production method of any of 12) to 14) above, the layered material of 4) above can be readily produced.

According to the layered material production method of 17) or 18) above, the contact area between the metal sheet and the ceramic sheet can be increased, and occurrence of bonding defects between the metal sheet and ceramic sheet can be effectively prevented.

According to the layered material production method of 19) above, occurrence of bonding defects between the metal sheet and ceramic sheet can be effectively prevented.

According to the layered material production method of 20) above, occurrence of bonding defects between the metal sheet and ceramic sheet can be effectively prevented.

BRIEF DESCRIPTION OF THE DRAWINGS

FIG. 1 is a vertical cross-sectional view of a layered material according to Embodiment 1 of the present invention.
FIG. 2 is a vertical cross-sectional sketch showing a method for producing the layered material of FIG. 1.
FIG. 3 shows temperature ranges of heating upon practice of the method of FIG. 2.
FIG. 4 shows a first modification of the method for producing the layered material of FIG. 1, the method being shown in FIG. 2.
FIG. 5 shows a second modification of the method for producing the layered material of FIG. 1, the method being shown in FIG. 2.
FIG. 6 shows a third modification of the method for producing the layered material of FIG. 1, the method being shown in FIG. 2.
FIG. 7 shows a fourth modification of the method for producing the layered material of FIG. 1, the method being shown in FIG. 2.
FIG. 8 is a vertical cross-sectional view of a layered material according to Embodiment 2 of the present invention.
FIG. 9 is a vertical cross-sectional sketch showing a method for producing the layered material of FIG. 7.
FIG. 10 is a vertical cross-sectional view of a layered material according to Embodiment 3 of the present invention.
FIG. 11 is a vertical cross-sectional view of a layered material according to Embodiment 4 of the present invention.
FIG. 12 is a vertical cross-sectional sketch showing a method for producing the layered material of FIG. 11.
FIG. 13 is a vertical cross-sectional sketch showing a method for producing the layered material of Comparative Example 1.
FIG. 14 is a vertical cross-sectional sketch showing a method for producing the layered material of Comparative Example 2.
FIG. 15 shows the results of Example 10, and is an enlarged photograph showing two metal sheets and a ceramic sheet.
FIG. 16 shows the results of Example 10, and is an enlarged photograph showing the bonding interface between the Al metal sheet and the ceramic sheet.
FIG. 17 shows the results of Example 10, and is an enlarged photograph showing the bonding interface between the Al—Si alloy metal sheet and the ceramic sheet.

Figure 1:
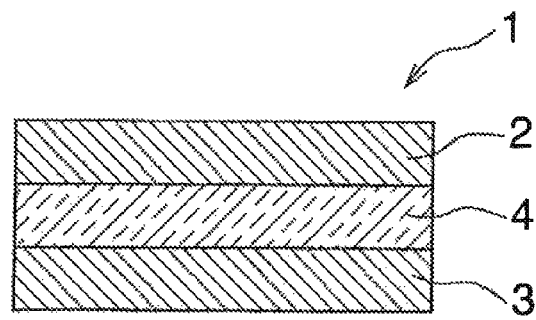
[FIG. 1]

DESCRIPTION OF REFERENCE NUMERALS (1), (30), (35), (40): layered material
(2), (3), (31), (36), (41): metal sheet
(4), (42): ceramic sheet

BEST MODES FOR CARRYING OUT THE INVENTION

Embodiments of the present invention will next be described with reference to the drawings.

In the following description, the terms "top" and "bottom" respectively correspond to the top and bottom of each drawing. The same components or elements throughout the drawings are denoted by the same reference numerals, and repeated description is omitted.

Embodiment 1

Figure 2:
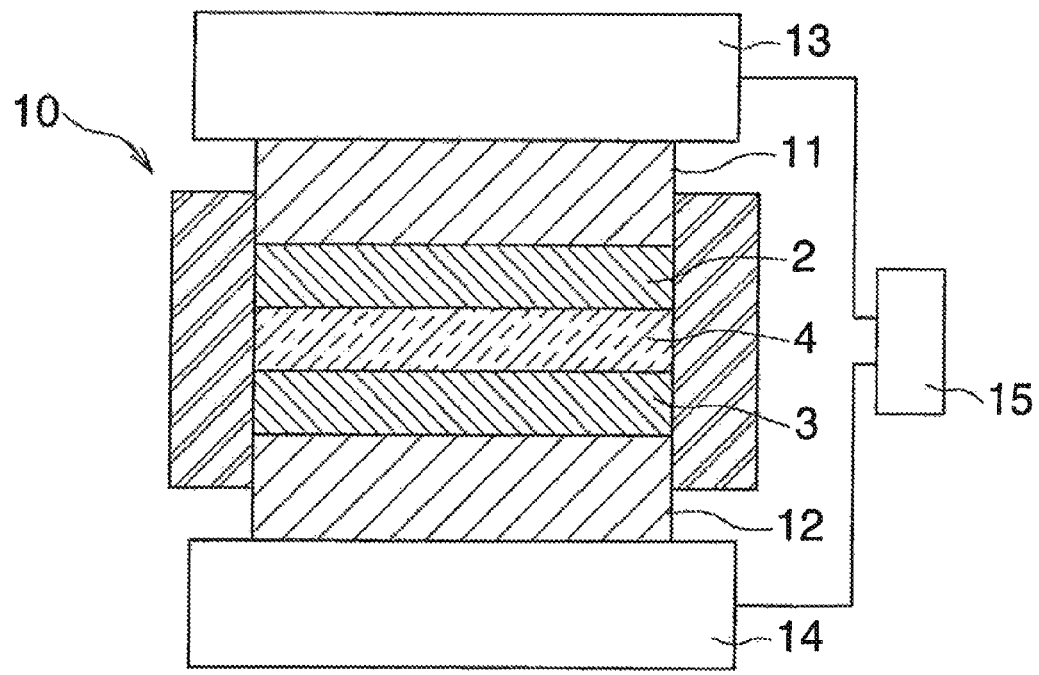
[FIG. 2]
Figure 3:
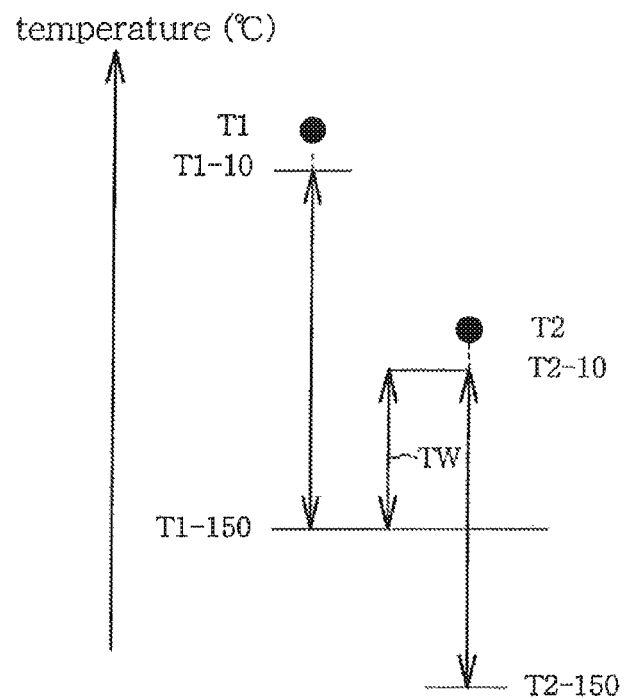
[FIG. 3]

This embodiment is shown in FIGS. 1 to 3. FIG. 1 shows a layered material according to Embodiment 1 of the present invention, and FIG. 2 shows a method for producing the layered material of FIG. 1. FIG. 3 shows temperature ranges of heating upon practice of the method of FIG. 2.

As shown in FIG. 1, the layered material (1) includes a plurality of metal sheets (2) and (3) and at least one ceramic sheet (4), wherein the metal sheets (2) and (3) and the ceramic sheet (4) are stacked together such that the ceramic sheet (4) is adjacent to each of the metal sheets (2) and (3), and the ceramic sheet (4) is bonded to the adjacent metal sheets (2) and (3) through spark plasma sintering. In the layered material (1), the two (upper and lower) metal sheets (2) and (3) and the one ceramic sheet (4) are stacked together such that the ceramic sheet (4) is disposed between the metal sheets (2) and (3), and the metal sheets (2) and (3) are bonded to the ceramic sheet (4) through spark plasma sintering.

Each of the top and bottom surfaces of the layered material (1) (i.e., the top surface of the upper metal sheet (2) and the bottom surface of the lower metal sheet (3)) has a flatness of 100 µm or less.

Each of the upper and lower metal sheets (2) and (3) is formed of one material selected from the group consisting of Al, Cu, Ag, Au, Ni, Ti, an Al alloy, a Cu alloy, an Ag alloy, an Au alloy, an Ni alloy, and a Ti alloy. The material forming each of the upper and lower metal sheets (2) and (3) is appropriately selected from among the aforementioned ones such that the difference between the melting temperature of the upper metal sheet (2) and that of the lower metal sheet (3) is 140° C. or less. The melting points of employable materials for forming the upper and lower metal sheets (2) and (3) are as follows: Al: 660° C., Cu: 1,083° C., Ag: 961° C., Au: 1,063° C., Ni: 1,453° C., and Ti: 1,727° C. Generally, the melting points of an Al alloy, a Cu alloy, an Ag alloy, an Au alloy, an Ni alloy, and a Ti alloy are respectively lower than those of Al, Cu, Ag, Au, Ni, and Ti. The upper and lower metal sheets (2) and (3) may be formed of the same material or different materials. Each of the upper and lower metal sheets (2) and (3) preferably has a thickness of 3 mm or less. Each of the upper and lower metal sheets (2) and (3) is formed through any known appropriate method.

The ceramic sheet (4) is formed of one electrically insulating material selected from the group consisting of AlN, $Al_2O_3$, $Si_3N_4$, SiC, $Y_2O_3$, CaO, BN, and BeO. The ceramic sheet (4) preferably has a thickness of 1 mm or less. The ceramic sheet (4) is formed through, for example, spark plasma sintering of powder of one material selected from the group consisting of AlN, $Al_2O_3$, $Si_3N_4$, SiC, $Y_2O_3$, CaO, BN, and BeO in the presence of an appropriate sintering aid. The ceramic sheet (4) may be formed through hot isostatic pressing (HIP) of powder of one material selected from the group consisting of AlN, $Al_2O_3$, $Si_3N_4$, SiC, $Y_2O_3$, CaO, BN, and BeO.

The melting points (or decomposition points) of the aforementioned respective ceramic materials are as follows: AlN: 2,200° C., $Al_2O_3$: 2,050° C., $Si_3N_4$: 1,900° C., SiC: 2,000° C., $Y_2O_3$: 2,400° C., CaO: 2,570° C., BN: 3,000° C., and BeO: 2,570° C., each of which is higher than the melting points of the aforementioned materials for forming the upper and lower metal sheets (2) and (3).

Although not illustrated, the layered material (1) is employed for producing a power module base as described below.

Specifically, the upper metal sheet (2) is subjected to etching to thereby form a circuit, and the upper metal sheet (2) is employed as a wiring layer. Separately, there are provided a heat radiation material (e.g., heat sink) formed of a highly thermally conductive material such as Al, an Al alloy, Cu, or a Cu alloy, as well as a stress relaxation member which is formed of a highly thermally conductive material such as Al, an Al alloy, Cu, or a Cu alloy and which has a stress absorbing space. The stress relaxation member is formed of, for example, an Al or Al alloy sheet having a plurality of through-holes, each of which serves as a stress absorbing space.

The layered material (1) is placed on the heat radiation material via the stress relaxation member, and brazing between the lower metal sheet (2) (3) and the stress relaxation member is carried out simultaneously with brazing between the stress relaxation member and the heat radiation material. Thus, a power module base is produced.

The heat radiation material may be formed of an upper hollow wall having a cooling fluid path therein. The cooling fluid may be liquid or gas. The heat radiation material may be formed of a heat radiation substrate having a heat radiation fin on the surface opposite the surface bonded to the stress relaxation member.

A power device is mounted on the upper metal sheet (2) of the layered material (1) of the power module base through soldering, to thereby produce a power module. In the power module, heat generated from the power device is transferred to the heat radiation material via the upper metal sheet (2), the ceramic sheet (4), the lower metal sheet (3), and the stress relaxation member, and the thus-transferred heat is radiated from the heat radiation material. Even when thermal stress occurs in the power module base through warpage of the heat radiation material toward the ceramic sheet (4) attributed to the difference in thermal expansion coefficient between the ceramic sheet (4) of the layered material (1) and the heat radiation material, since the thermal stress is reduced by the action of the stress relaxation member, cracking in the ceramic sheet (4) or occurrence of warpage in the bonding surface between the heat radiation material and the lower metal sheet (3) is prevented.

Next will be described the method for producing the layered material (1) with reference to FIGS. 2 and 3.

Firstly, there are provided two metal sheets (2) and (3), each being produced through a common technique from one material selected from the group consisting of Al, Cu, Ag, Au, Ni, Ti, an Al alloy, a Cu alloy, an Ag alloy, an Au alloy, an Ni alloy, and a Ti alloy, as well as one ceramic sheet (4) produced through a common technique from one material selected from the group consisting of AlN, $Al_2O_3$, $Si_3N_4$, SiC, $Y_2O_3$, CaO, BN, and BeO.

The material forming each of the two metal sheets (2) and (3) is appropriately selected from among the aforementioned ones such that the difference in melting temperature between the metal sheets (2) and (3) is 140° C. or less. Preferably, each of the metal sheets (2) and (3) has an arithmetic mean surface roughness (Ra) of 1.0 µm or less and a thickness of 3 mm or less. Preferably, the ceramic sheet (4) has an arithmetic mean surface roughness (Ra) of 1.5 µm or less and a thickness of 1 mm or less.

Subsequently, the metal sheets (2) and (3) and the ceramic sheet (4) are stacked and placed in an electrically conductive graphite sintering die (10) of a spark plasma sintering apparatus so that the ceramic sheet (4) is disposed between the metal sheets (2) and (3). The vertical height of the die (10) is greater than the total thickness of the metal sheets (2) and (3) and the ceramic sheet (4), and both the top and bottom ends of the die (10) project outward from the upper and lower metal sheets (2) and (3) in a vertical direction. Then, graphite punches (11) and (12) are placed on the top and bottom of the stacked product of the upper metal sheet (2), the ceramic sheet (4), and the lower metal sheet (3) in the die (10), and electrodes (13) and (14) are brought into electrical contact with the top surface of the upper punch (11) and the bottom surface of the lower punch (12), respectively. In this state, electrical conduction is secured between the electrodes (13) and (14) by means of the punches (11) and (12) and the die (10). The electrodes (13) and (14) are electrically connected to power supply (15).

Subsequently, in a vacuum atmosphere (1 to 10 Pa) or an inert gas (e.g., nitrogen or argon) atmosphere, pressure is applied to both sides (in a stacking direction) of the stacked product of the metal sheets (2) and (3) and the ceramic sheet (4) by means of the upper and lower punches (11) and (12), while pulse current is applied between the electrodes (13) and (14) by the power supply (15), to thereby heat the metal sheets (2) and (3) to a preset temperature. The stacked product is maintained at the temperature for a specific period of time, to thereby bond the metal sheets (2) and (3) to the ceramic sheet (4). When the metal sheets (2) and (3) have the same melting temperature, the metal sheets (2) and (3) are heated to a temperature lower by 10 to 150° C. than the melting temperature. When the metal sheets (2) and (3) have different melting temperatures, the metal sheets (2) and (3) are heated to a temperature between the temperature lower by 150° C. than the melting temperature of the higher-melting-temperature metal sheet and the temperature lower by 10° C. than the melting temperature of the lower-melting-temperature metal sheet. Specifically, as shown in FIG. 3, when the melting temperature of the higher-melting-temperature metal sheet is represented by T1° C., and the melting temperature of the lower-melting-temperature metal sheet is represented by T2° C., the heating temperature at which the higher-melting-temperature metal sheet can be bonded to the ceramic sheet through spark plasma sintering falls within a range of (T1−150)° C. to (T1−10)° C., and the heating temperature at which the lower-melting-temperature metal sheet can be bonded to the ceramic sheet through spark plasma sintering falls within a range of (T2−150)° C. to (T2−10)° C. Therefore, in a temperature range TW of (T1−150)° C. to (T2−10)° C., the two metal sheets can be simultaneously bonded to the ceramic sheet without melting of the lower-melting-temperature metal sheet. The temperature (T1−150)° C. may be equal to the temperature (T2−10)° C. Thus, the layered material (1) is produced.

The conditions for bonding between the metal sheets (2) and (3) and the ceramic sheet (4) through the aforementioned method vary with the types of materials of the metal sheets (2) and (3) and the ceramic sheet (4), or the dimensions of the sheets. For example, the bonding conditions are as follows: pulse current to be applied: 1,000 to 30,000 A, pressure: 10 to 100 MPa, and retention time at bonding temperature: 1 to 30 min.

The mechanism by which the metal sheets (2) and (3) are bonded to the ceramic sheet (4) has not been elucidated. However, the mechanism is considered to be as follows.

Specifically, when pressure is applied to both sides (in a stacking direction) of the stacked product of the metal sheets (2) and (3) and the ceramic sheet (4), since the metal sheets (2) and (3) yield, the materials forming the metal sheets (2) and (3) enter micro dents on the surface of the ceramic sheet (4), and thus the contact area between the metal sheets (2) and (3) and the ceramic sheet (4) is increased. In this state, when electrical conduction is achieved between the electrodes (13) and (14) of the spark plasma sintering apparatus, and pulse current is applied between the electrodes (13) and (14), to thereby heat the stacked product to a temperature between the temperature lower by 150° C. than the melting temperature of the higher-melting-temperature metal sheet and the temperature lower by 10° C. than the melting temperature of the lower-melting-temperature metal sheet, the metal sheets (2) and (3) are softened, and the contact area between the metal sheets (2) and (3) and the ceramic sheet (4) is further increased. In this case, when discharge plasma is radiated in the vicinity of the contact portion between the surfaces of the metal sheets (2) and (3) and the surface of the ceramic sheet (4), oxide film on the surfaces of the metal sheets (2) and (3) is broken and removed, and thus active surfaces are exposed. Conceivably, when the thus-exposed active surfaces of the metal sheets (2) and (3) come into contact with the surface of the ceramic sheet (4), the metal sheets (2) and (3) are bonded to the ceramic sheet (4) by means of mass diffusion.

FIGS. 4 to 7 shows modifications of the method for producing the layered material (1).

Figure 4:
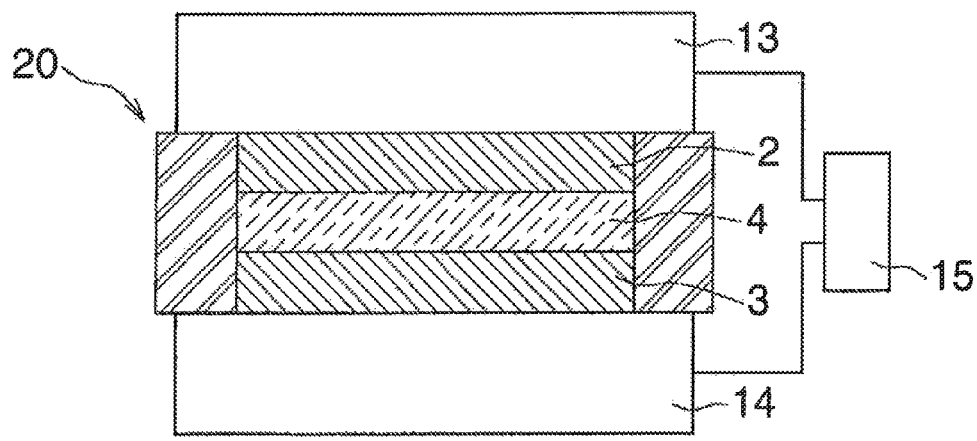
[FIG. 4]

In the case of a method shown in FIG. 4, no punches are provided between the upper and lower metal sheets (2) and (3) and the upper and lower electrodes (13) and (14) of the spark plasma sintering apparatus. The height of an electrically conductive graphite sintering die (20) is slightly greater than the total thickness of the metal sheets (2) and (3) and the ceramic sheet (4). Therefore, when pressure is applied to both the top and bottom sides of the stacked product of the metal sheets (2) and (3) and the ceramic sheet (4) by means of the upper and lower electrodes (13) and (14), the upper and lower electrodes (13) and (14) come into contact with the upper and lower metal sheets (2) and (3), respectively. Thus, in the pressurized state, electrical conduction is secured between the electrodes (13) and (14) by means of the die (20). The layered material (1) is produced in the same manner as that shown in FIG. 2 (except for the modification of the spark plasma sintering apparatus).

Figure 5:
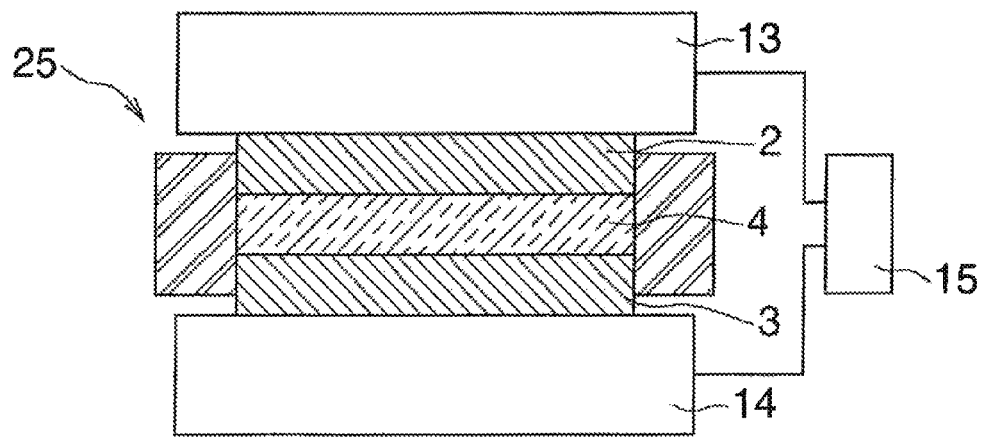
[FIG. 5]

In the case of a method shown in FIG. 5, no punches are provided between the upper and lower metal sheets (2) and (3) and the upper and lower electrodes (13) and (14) of the spark plasma sintering apparatus. The height of an electrically conductive graphite sintering die (25) is smaller than the total thickness of the metal sheets (2) and (3) and the ceramic sheet (4), and is greater than the thickness of the ceramic sheet (4). Therefore, when pressure is applied to both the top and bottom sides of the stacked product of the metal sheets (2) and (3) and the ceramic sheet (4) by means of the upper and lower electrodes (13) and (14), the die (25) does not come into contact with the electrodes (13) and (14), and is disposed so as to extend over the upper and lower metal sheets (2) and (3). Thus, in the pressurized state, electrical conduction is secured between the electrodes (13) and (14) by means of the upper and lower metal sheets (2) and (3) and the die (25). The layered material (1) is produced in the same manner as that shown in FIG. 2 (except for the modification of the spark plasma sintering apparatus).

Figure 6:
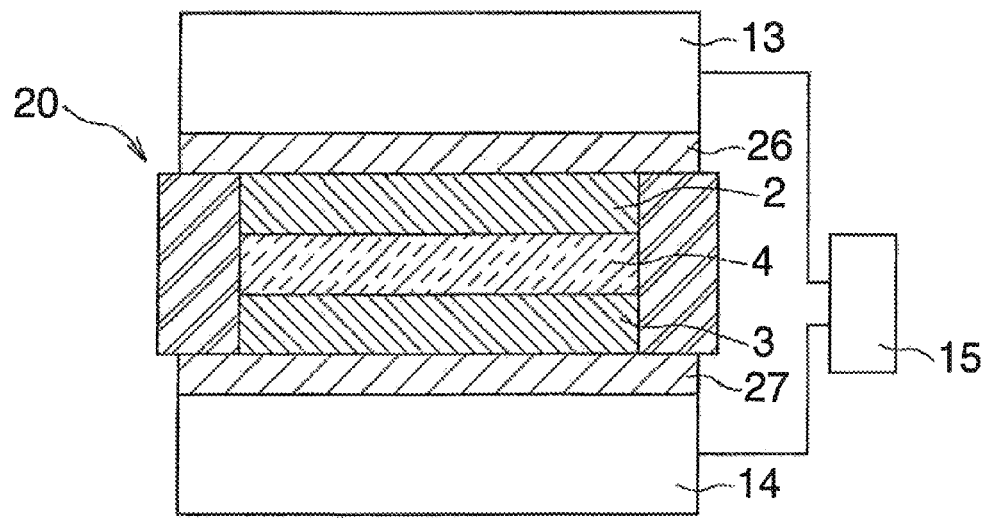
[FIG. 6]

In the case of a method shown in FIG. 6, the spark plasma sintering apparatus employed in the method shown in FIG. 4 is modified such that electrically conductive graphite spacers

(26) and (27) are respectively provided between the upper electrode (13) and the upper metal sheet (2) and between the lower electrode (14) and the lower metal sheet (3). The size of the spacers (26) and (27) is greater than that of openings at both the top and bottom ends of the die (20). Therefore, when pressure is applied to both the top and bottom sides of the stacked product of the metal sheets (2) and (3) and the ceramic sheet (4) by means of the upper and lower electrodes (13) and (14) via the spacers (26) and (27), the upper and lower spacers (26) and (27) come into contact with the upper and lower metal sheets (2) and (3), respectively. Thus, in the pressurized state, electrical conduction is secured between the electrodes (13) and (14) by means of the spacers (26) and (27) and the die (20). The layered material (1) is produced in the same manner as that shown in FIG. 4 (except for the modification of the spark plasma sintering apparatus).

Figure 7:
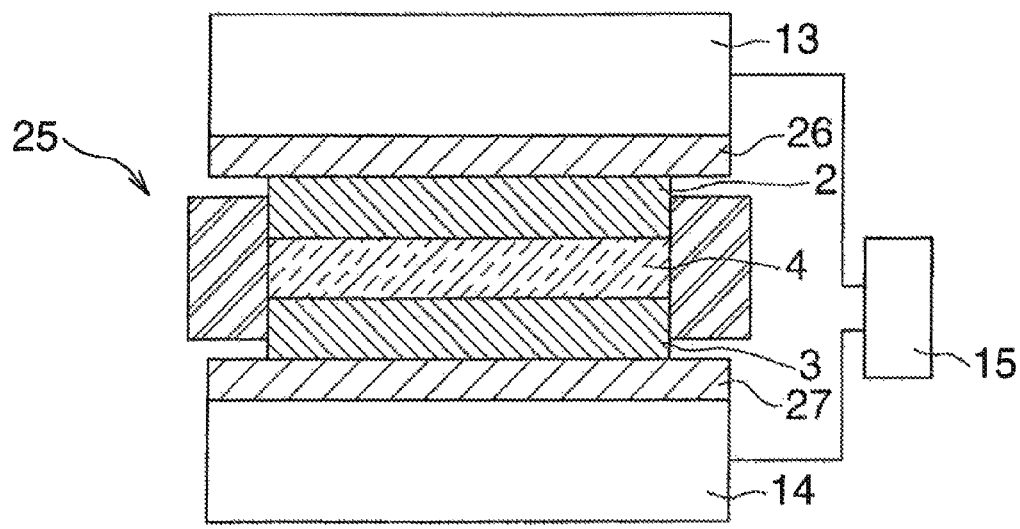
[FIG. 7]

In the case of a method shown in FIG. 7, the spark plasma sintering apparatus employed in the method shown in FIG. 5 is modified such that graphite spacers (26) and (27) are respectively provided between the upper electrode (13) and the upper metal sheet (2) and between the lower electrode (14) and the lower metal sheet (3). The size of the spacers (26) and (27) is greater than that of openings at both the top and bottom ends of the die (25). Therefore, when pressure is applied to both the top and bottom sides of the stacked product of the metal sheets (2) and (3) and the ceramic sheet (4) by means of the upper and lower electrodes (13) and (14) via the graphite spacers (26) and (27), the die (25) does not come into contact with the electrodes (13) and (14), and is disposed so as to extend over the upper and lower metal sheets (2) and (3). Thus, in the pressurized state, electrical conduction is secured between the electrodes (13) and (14) by means of the upper and lower spacers (26) and (27), the upper and lower metal sheets (2) and (3), and the die (25). The layered material (1) is produced in the same manner as that shown in FIG. 5 (except for the modification of the spark plasma sintering apparatus).

Embodiment 2

Figure 8:
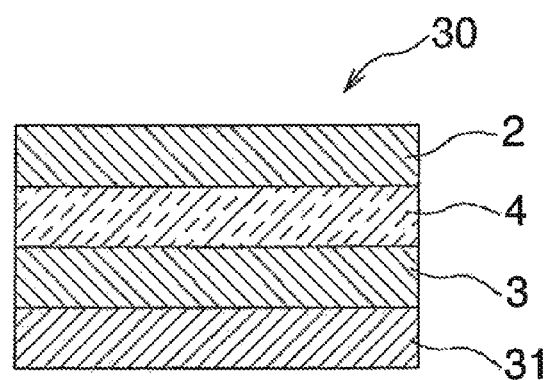
[FIG. 8]
Figure 9:
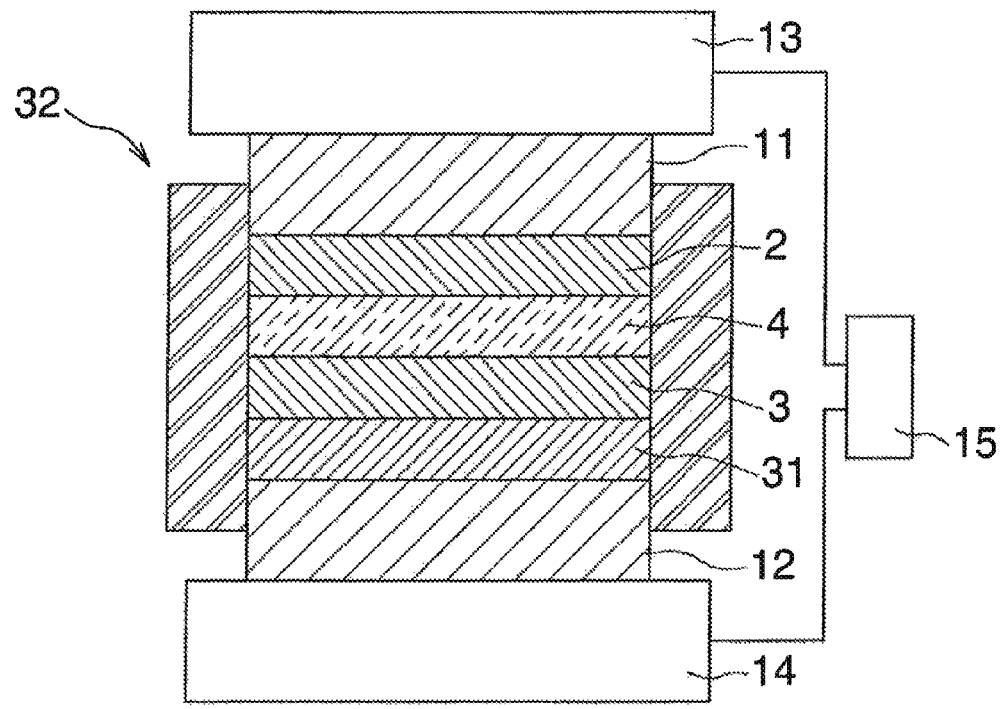
[FIG. 9]

This embodiment is shown in FIGS. 8 and 9. FIG. 8 shows a layered material according to Embodiment 2 of the present invention, and FIG. 9 shows a method for producing the layered material of FIG. 8.

As shown in FIG. 8, the layered material (30) is a modification of the layered material (1) according to Embodiment 1, wherein a metal sheet (31) made of a material which does not melt at the heating temperature during spark plasma sintering for producing the layered material (30) is stacked and bonded, through spark plasma sintering, to the surface of at least one of the upper and lower metal sheets (2) and (3) on the side opposite the surface bonded to the ceramic sheet (4) (in this case, to the bottom surface of the lower metal sheet (3)). Specifically, when the metal sheets (2) and (3) have the same melting temperature, the metal sheet (31) is formed of a material having a melting temperature higher than that of the metal sheets (2) and (3), whereas when the metal sheets (2) and (3) have different melting temperatures, the metal sheet (31) is formed of a material having a melting temperature higher than that of the lower-melting-temperature metal sheet. For example, when the metal sheets (2) and (3) are formed of Al or an Al alloy, the metal sheet (31) is formed of one material selected from the group consisting of Cu, Ag, Au, Ni, Ti, a Cu alloy, an Ag alloy, an Au alloy, an Ni alloy, and a Ti alloy.

Although not illustrated, the layered material (30) is employed for producing a power module base as described below.

The upper metal sheet (2) is subjected to etching to thereby form a circuit, and the upper metal sheet (2) is employed as a wiring layer. Separately, there are provided a heat radiation material (e.g., heat sink) formed of a highly thermally conductive material such as Al, an Al alloy, Cu, or a Cu alloy, as well as a stress relaxation member which is formed of a highly thermally conductive material such as Al, an Al alloy, Cu, or a Cu alloy and which has a stress absorbing space. The stress relaxation member is formed of, for example, an Al or Al alloy sheet having a plurality of through-holes, each of which serves as a stress absorbing space.

The layered material (30) is placed on the heat radiation material via the stress relaxation member, and brazing between the high-melting-temperature metal sheet (31) and the stress relaxation member is carried out simultaneously with brazing between the stress relaxation member and the heat radiation material. Thus, a power module base is produced.

The heat radiation material may be formed of an upper hollow wall having a cooling fluid path therein. The cooling fluid may be liquid or gas. The heat radiation material may be formed of a heat radiation substrate having a heat radiation fin on the surface opposite the surface bonded to the stress relaxation member.

A power device is mounted on the upper metal sheet (2) of the layered material (30) of the power module base through soldering, to thereby produce a power module. In the power module, heat generated from the power device is transferred to the heat radiation material via the upper metal sheet (2), the ceramic sheet (4), the lower metal sheet (3), the high-melting-temperature metal sheet (31), and the stress relaxation member, and the thus-transferred heat is radiated from the heat radiation material. In this case, the high-melting-temperature metal sheet (31) exhibits high thermal conductivity, and thus serves as a heat spreader. Therefore, heat transferred to the high-melting-temperature metal sheet (31) is diffused throughout the sheet (31) and then transferred to the heat radiation material via the stress relaxation member, whereby heat radiation performance is improved. Even when thermal stress occurs in the power module base through warpage of the heat radiation material toward the ceramic sheet (4) attributed to the difference in thermal expansion coefficient between the ceramic sheet (4) of the layered material (30) and the heat radiation material, since the thermal stress is reduced by the action of the stress relaxation member, cracking in the ceramic sheet (4) or occurrence of warpage in the bonding surface between the heat radiation material and the ceramic sheet (4) is prevented.

Next will be described the method for producing the layered material (30) with reference to FIG. 9.

Firstly, there are provided the two metal sheets (2) and (3) and the ceramic sheet (4) employed for producing the layered material (1) according to Embodiment 1, as well as a high-melting-temperature metal sheet (31) formed of one material selected from the group consisting of Cu, Ag, Au, Ni, Ti, a Cu alloy, an Ag alloy, an Au alloy, an Ni alloy, and a Ti alloy.

Preferably, the high-melting-temperature metal sheet (31) has an arithmetic mean surface roughness (Ra) of 1.0 μm or less and a thickness of 3 mm or less.

Subsequently, the metal sheets (2) and (3), the ceramic sheet (4), and the high-melting-temperature metal sheet (31) are stacked and placed in an electrically conductive graphite sintering die (32) of a spark plasma sintering apparatus so that the ceramic sheet (4) is disposed between the metal sheets (2) and (3), and the high-melting-temperature metal sheet (31) is disposed below the lower metal sheet (3). The vertical height of the die (32) is greater than the total thickness of the metal sheets (2) and (3), the ceramic sheet (4), and the high-melting-temperature metal sheet (31), and both the top and bottom ends of the die (32) project outward from the upper and lower metal sheets (2) and (3) in a vertical direction. Then, graphite punches (11) and (12) are placed on the top and bottom of the stacked product of the upper metal sheet (2)(3), the ceramic sheet (4), the lower metal sheet (3), and the high-melting-temperature metal sheet (31) in the die (32), and electrodes (13) and (14) are brought into electrical contact with the top surface of the upper punch (11) and the bottom surface of the lower punch (12), respectively. In this state, electrical conduction is secured between the electrodes (13) and (14) by means of the punches (11) and (12) and the die (32).

Subsequently, in a vacuum atmosphere (1 to 10 Pa) or an inert gas (e.g., nitrogen or argon) atmosphere, pressure is applied to both sides (in a stacking direction) of the stacked product of the metal sheets (2) and (3), the ceramic sheet (4), and the high-melting-temperature metal sheet (31) by means of the upper and lower punches (11) and (12), while pulse current is applied between the electrodes (13) and (14), to thereby heat the stacked product to a preset temperature. When the metal sheets (2) and (3) have the same melting temperature, the stacked product is heated to a temperature lower by 10 to 150° C. than the melting temperature of the metal sheets (2) and (3). When the metal sheets (2) and (3) have different melting temperatures, the stacked product is heated to a temperature between the temperature lower by 150° C. than the melting temperature of the higher-melting-temperature metal sheet of the metal sheets (2) and (3) and the temperature lower by 10° C. than the melting temperature of the lower-melting-temperature metal sheet. The stacked product is maintained at the temperature for a specific period of time, to thereby bond the metal sheets (2) and (3) to the ceramic sheet (4), and to bond the lower metal sheet (3) to the high-melting-temperature metal sheet (31). Thus, the layered material (30) is produced.

The conditions for bonding of the metal sheets (2) and (3) to the ceramic sheet (4) or bonding the lower metal sheet (3) to the high-melting-temperature metal sheet (31) through the aforementioned method vary with the types of materials of the metal sheets (2) and (3), the ceramic sheet (4), and the high-melting-temperature metal sheet (31), or the dimensions of the sheets. For example, the bonding conditions are as follows: pulse current to be applied: 1,000 to 30,000 A, pressure: 10 to 100 MPa, and retention time at bonding temperature: 1 to 30 min.

Embodiment 3

Figure 10:
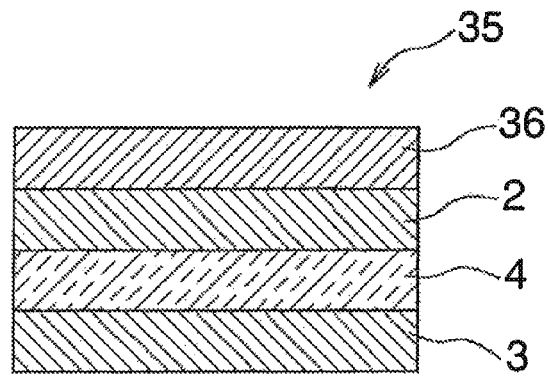
[FIG. 10]

This embodiment is shown in FIG. 10. FIG. 10 shows a layered material according to Embodiment 3 of the present invention.

As shown in FIG. 10, the layered material (35) is a modification of the layered material (1) according to Embodiment 1, wherein a high-melting-temperature metal sheet (36) made of a material which does not melt at the heating temperature during spark plasma sintering for producing the layered material (35) is stacked and bonded, through spark plasma sintering, to the surface of at least one of the upper and lower metal sheets (2) and (3) on the side opposite the surface bonded to the ceramic sheet (4) (in this case, to the top surface of the upper metal sheet (2)).

The metal sheets (2) and (3) are formed of Al or an Al alloy, and the high-melting-temperature metal sheet (36) is formed of one material selected from the group consisting of Cu, Ag, Au, Ni, a Cu alloy, an Ag alloy, an Au alloy, and an Ni alloy. Such a material exhibits high thermal conductivity and excellent solderability.

Although not illustrated, the layered material (35) is employed for producing a power module base as described below.

The surface of the high-melting-temperature metal sheet (36) is subjected to masking and etching, to thereby expose a portion of the upper metal sheet (2), and the thus-exposed portion of the upper metal sheet (2) is further subjected to etching, to thereby form a circuit. Thus, the upper metal sheet (2), which has thereon the high-melting-temperature metal sheet (36), is employed as a wiring layer. Separately, there are provided a heat radiation material (e.g., heat sink) formed of a highly thermally conductive material such as Al, an Al alloy, Cu, or a Cu alloy, as well as a stress relaxation member which is formed of a highly thermally conductive material such as Al, an Al alloy, Cu, or a Cu alloy and which has a stress absorbing space. The stress relaxation member is formed of, for example, an Al or Al alloy sheet having a plurality of through-holes, each of which serves as a stress absorbing space.

The layered material (35) is placed on the heat radiation material via the stress relaxation member, and brazing between the lower metal sheet (3) and the stress relaxation member is carried out simultaneously with brazing between the stress relaxation member and the heat radiation material. Thus, a power module base is produced.

The heat radiation material may be formed of an upper hollow wall having a cooling fluid path therein. The cooling fluid may be liquid or gas. The heat radiation material may be formed of a heat radiation substrate having a heat radiation fin on the surface opposite the surface bonded to the stress relaxation member.

A power device is mounted, through soldering, on the high-melting-temperature metal sheet (36) formed on the surface of the upper metal sheet (2) of the layered material (35) of the power module base, to thereby produce a power module. Since the high-melting-temperature metal sheet (36) is formed of a material exhibiting excellent solderability, the surface of the upper metal sheet (2) is not required to be subjected to a treatment for improving solderability (e.g., Ni plating), and thus production cost can be reduced.

In the power module, heat generated from the power device is transferred to the heat radiation material via the high-melting-temperature metal sheet (36), the upper metal sheet (2), the ceramic sheet (4), the lower metal sheet (3), and the stress relaxation member, and the thus-transferred heat is radiated from the heat radiation material.

A high-melting-temperature metal sheet (31) formed of the same material as in the case of Embodiment 2 may be stacked and bonded to the bottom surface of the lower metal sheet (3) of the layered material (35) according to Embodiment 3.

Embodiment 4

Figure 11:
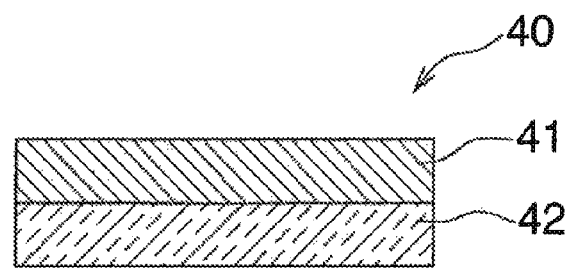
[FIG. 11]
Figure 12:
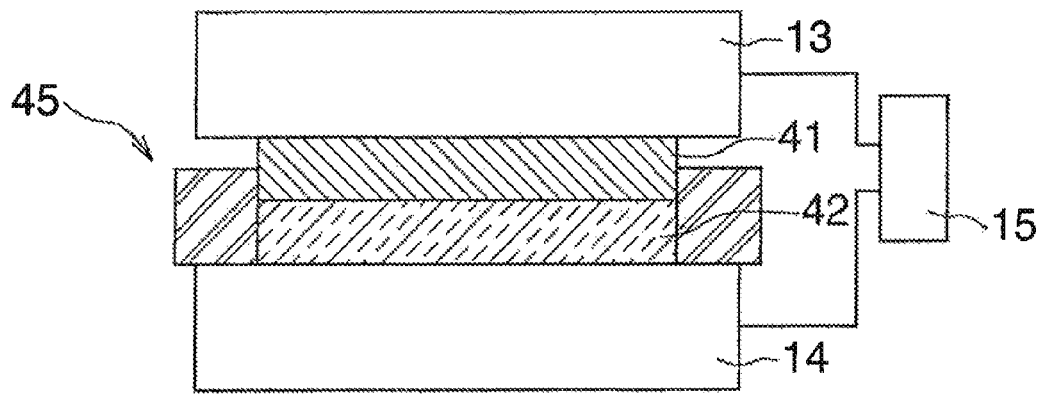
[FIG. 12]

This embodiment is shown in FIGS. 11 and 12. FIG. 11 shows a layered material according to Embodiment 4 of the present invention, and FIG. 12 shows a method for producing the layered material of FIG. 11.

As shown in FIG. 11, the layered material (40) includes one metal sheet (41) and one ceramic sheet (42), wherein these sheets are stacked together such that the metal sheet (41) is disposed atop the ceramic sheet (42), and the metal sheet (41) is bonded to the ceramic sheet (42) through spark plasma sintering.

Each of the top and bottom surfaces of the layered material (40) (i.e., the top surface of the metal sheet (2) and the bottom surface of the ceramic sheet (42)) has a flatness of 100 μm or less.

The metal sheet (41) and the ceramic sheet (42) are respectively formed of the same materials as in the cases of the metal sheets (2) and (3) and the ceramic sheet (4) of the layered material (1) according to Embodiment 1. In Embodiment 3, the melting temperature of the metal sheet (41) is not required to be taken into consideration.

In the layered material (40) according to Embodiment 4, an additional metal sheet made of a material which does not melt at the heating temperature during spark plasma sintering may be stacked and bonded, through spark plasma sintering, to the surface of the metal sheet (41) on the side opposite the surface bonded to the ceramic sheet.

Although not illustrated, the layered material (40) is employed for producing a power module base as described below.

The metal sheet (41) is subjected to etching to thereby form a circuit, and the metal sheet (41) is employed as a wiring layer. Separately, there are provided a heat radiation material (e.g., heat sink) formed of a highly thermally conductive material such as Al, an Al alloy, Cu, or a Cu alloy, as well as a stress relaxation member which is formed of a highly thermally conductive material such as Al, an Al alloy, Cu, or a Cu alloy and which has a stress absorbing space. The stress relaxation member is formed of, for example, an Al or Al alloy sheet having a plurality of through-holes, each of which serves as a stress absorbing space.

The layered material (40) is placed on the heat radiation material via the stress relaxation member, and brazing between the ceramic sheet (42) and the stress relaxation member is carried out simultaneously with brazing between the stress relaxation member and the heat radiation material. Thus, a power module base is produced.

The heat radiation material may be formed of an upper hollow wall having a cooling fluid path therein. The cooling fluid may be liquid or gas. The heat radiation material may be formed of a heat radiation substrate having a heat radiation fin on the surface opposite the surface bonded to the stress relaxation member.

A power device is mounted on the metal sheet (41) of the layered material (40) of the power module base through soldering, to thereby produce a power module. In the power module, heat generated from the power device is transferred to the heat radiation material via the metal sheet (41), the ceramic sheet (42), and the stress relaxation member, and the thus-transferred heat is radiated from the heat radiation material. Even when thermal stress occurs in the power module base through warpage of the heat radiation material toward the ceramic sheet (42) attributed to the difference in thermal expansion coefficient between the ceramic sheet (42) of the layered material (40) and the heat radiation material, since the thermal stress is reduced by the action of the stress relaxation member, cracking in the ceramic sheet (42) or occurrence of warpage in the bonding surface between the heat radiation material and the ceramic sheet (42) is prevented.

Next will be described the method for producing the layered material (40) with reference to FIG. 12.

Firstly, there are provided one metal sheet (41) and one ceramic sheet (42) that are respectively formed of the same materials as in the cases of any of the upper and lower metal sheets (2) and (3) and the ceramic sheet (4), which are employed for producing the layered material (1) according to Embodiment 1.

Subsequently, the metal sheet (41) and the ceramic sheet (42) are stacked and placed in an electrically conductive graphite sintering die (45) of a spark plasma sintering apparatus so that the metal sheet (41) is disposed atop the ceramic sheet (42). The vertical height of the die (45) is greater than the thickness of the ceramic sheet (42), and is smaller than the total thickness of the metal sheet (41) and the ceramic sheet (42). A portion of the metal sheet (41) projects upward from the die (45). Then, electrodes (13) and (14) are respectively placed on the top and bottom of the stacked product of the metal sheet (41) and the ceramic sheet (42), and the electrodes (13) and (14) are brought into contact with the metal sheet (41) and the ceramic sheet (42), respectively. In this state, electrical conduction is secured between the electrodes (13) and (14) by means of the metal sheet (41) and the die (45).

Subsequently, in a vacuum atmosphere (1 to 10 Pa) or an inert gas (e.g., nitrogen or argon) atmosphere, pressure is applied to both the top and bottom sides of the stacked product of the metal sheet (41) and the ceramic sheet (42) by means of the upper and lower electrodes (13) and (14), while pulse current is applied between the electrodes (13) and (14), to thereby heat the stacked product to a temperature lower by 10 to 150° C. than the melting temperature of the metal sheet (41). The stacked product is maintained at the temperature for a specific period of time, to thereby bond the metal sheet (41) to the ceramic sheet (42). Thus, the layered material (40) is produced.

The conditions for bonding of the metal sheet (41) to the ceramic sheet (42) through the aforementioned method vary with the types of materials of the metal sheet (41) and the ceramic sheet (42), or the dimensions of the sheets. For example, the bonding conditions are as follows: pulse current to be applied: 1,000 to 30,000 A, pressure: 10 to 100 MPa, and retention time at bonding temperature: 1 to 30 min.

In the aforementioned Embodiments 2 to 4, the mechanism by which the metal sheet(s) and the ceramic sheet are bonded together is considered to be the same as in the case of Embodiment 1.

The layered material of the present invention will next be described with reference to Examples and Comparative Examples. The layered materials of the below-described Examples correspond to the layered material according to Embodiment 1.

EXAMPLES 1 TO 7 AND COMPARATIVE EXAMPLES 1 AND 2

In Examples 1 to 7 and Comparative Examples 1 and 2, metal sheets and a ceramic sheet were bonded together through spark plasma sintering at different heating temperatures.

There were provided two metal sheets (2) and (3), each being formed of Al (purity: 99.9 wt. %) and having dimensions of 34 mm in length, 28 mm in width, and 1.0 mm in thickness, as well as one ceramic sheet (4) formed of AlN (containing $Y_2O_3$ in an amount of about 5 wt. %) having dimensions of 34 mm in length, 28 mm in width, and 0.635 mm in thickness. The surfaces of the metal sheets (2) and (3) and the ceramic sheet (4) were subjected to degreasing treatment with an organic solvent. Treatment for removal of oxide film was not carried out. Both surfaces of each of the metal sheets (2) and (3) have a surface roughness Ra of 0.3 μm, and both surfaces of the ceramic sheet (4) have a surface roughness Ra of 0.8 μm.

Subsequently, the metal sheets (2) and (3) and the ceramic sheet (4) were stacked and placed in a sintering die (10) as shown in FIG. 2 so that the ceramic sheet (4) was disposed between the metal sheets (2) and (3). Graphite punches (11) and (12) were placed on the top and bottom of the stacked product of the metal sheets (2) and (3) and the ceramic sheet (4) in the die (10), and electrodes (13) and (14) were brought into contact with the top surface of the upper punch (11) and the bottom surface of the lower punch (12), respectively.

Then, in a vacuum atmosphere (1 to 10 Pa), a pressure of 20 MPa was applied to both the top and bottom sides of the stacked product of the metal sheets (2) and (3) and the ceramic sheet (4) by means of the upper and lower punches (11) and (12), while a pulse current (maximum: 2,000 A) was applied between the electrodes (13) and (14), to thereby heat the metal sheets (2) and (3) and the ceramic sheet (4) to a temperature shown in Table 1 over five minutes. The stacked product was maintained at the temperature for five minutes, to thereby bond the metal sheets (2) and (3) to the ceramic sheet (4). Thereafter, application of current between the electrodes (13) and (14) was stopped, followed by cooling, to thereby produce a layered material (1) having a three-layer structure.

In Examples 1 to 7, melting of the metal sheets (2) and (3) was not observed in the thus-produced layered material (1), and the metal sheets were found to be completely bonded to the ceramic sheet (4). In contrast, in Comparative Example 1, the bonding area between the metal sheets (2) and (3) and the ceramic sheet (4) was small, and the metal sheets (2) and (3) were readily removed from the ceramic sheet (4).

Table 1 shows heating temperatures and bonding states.

TABLE 1

| | Heating temperature | Bonding state | Note |
|---|---|---|---|
| Comparative Example 1 | 500 | x | Small bonding area |
| Example 1 | 510 | o | |
| 2 | 520 | o | |
| 3 | 550 | o | |
| 4 | 580 | o | |
| 5 | 600 | o | |
| 6 | 620 | o | |
| 7 | 650 | o | |
| Comparative Example 2 | 660 | x | Melting of metal sheets |

EXAMPLE 8

In Example 8, the layered material (1) according to Embodiment 1 was produced.

There were provided two metal sheets (2) and (3), each being formed of Al (purity: 99.99 wt. %) and having dimensions of 34 mm in length, 28 mm in width, and 0.6 mm in thickness, as well as one AlN ceramic sheet (4) having dimensions of 34 mm in length, 28 mm in width, and 0.635 mm in thickness. The surfaces of the metal sheets (2) and (3) and the ceramic sheet (4) were subjected to degreasing treatment with an organic solvent. Treatment for removal of oxide film was not carried out. Both surfaces of each of the metal sheets (2) and (3) have a surface roughness Ra of 0.3 μm, and both surfaces of the ceramic sheet (4) have a surface roughness Ra of 0.8 μm.

Subsequently, the metal sheets (2) and (3) and the ceramic sheet (4) were stacked and placed in a sintering die (10) as shown in FIG. 2 so that the ceramic sheet (4) was disposed between the metal sheets (2) and (3). Graphite punches (11) and (12) were placed on the top and bottom of the stacked product of the metal sheets (2) and (3) and the ceramic sheet (4) in the die (10), and electrodes (13) and (14) were brought into contact with the top surface of the upper punch (11) and the bottom surface of the lower punch (12), respectively.

Then, in a vacuum atmosphere (1 to 10 Pa), a pressure of 20 MPa was applied to both the top and bottom sides of the stacked product of the metal sheets (2) and (3) and the ceramic sheet (4) by means of the upper and lower punches (11) and (12), while a pulse current (maximum: 1,500 A) was applied between the electrodes (13) and (14), to thereby heat the metal sheets (2) and (3) and the ceramic sheet (4) to 575° C. over 15 minutes. The stacked product was maintained at 575° C. for five minutes, to thereby bond the metal sheets (2) and (3) to the ceramic sheet (4). The heating temperature 575° C. for bonding corresponds to a temperature falling within a range lower by 10 to 150° C. than the melting point (660° C.) of Al (purity: 99.99 wt. %) forming the metal sheets (2) and (3). Thereafter, application of current between the electrodes (13) and (14) was stopped, followed by cooling, to thereby produce the layered material (1) having a three-layer structure.

The flatness of both surfaces of the thus-produced layered material (1) was measured and found to be 44 μm. A cross section of the thus-produced layered material (1) was observed for confirming the bonding state between the metal sheets (2) and (3) and the ceramic sheet (4). No defects were observed at the bonding interfaces; i.e., favorable bonding was achieved between these sheets.

EXAMPLE 9

The procedure of Example 1 was repeated, except that application of pulse current between the electrodes (13) and (14) was carried out in an inert gas (nitrogen) atmosphere, to thereby produce the layered material (1) having a three-layer structure.

The flatness of both surfaces of the thus-produced layered material (1) was measured and found to be 53 μm. A cross section of the thus-produced layered material (1) was observed for confirming the bonding state between the metal sheets and the ceramic sheet. No defects were observed at the bonding interfaces; i.e., favorable bonding was achieved between these sheets.

COMPARATIVE EXAMPLE 3

Figure 13:
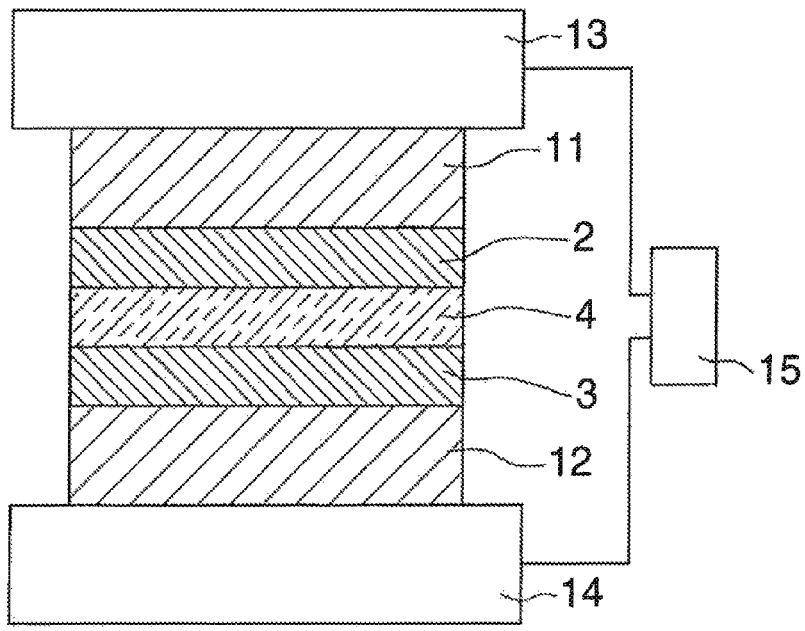
[FIG. 13]

In the same manner as in Example 1 (except that an electrically conductive graphite sintering die of a spark plasma sintering apparatus was not employed as shown in FIG. 13), two metal sheets (2) and (3) and one ceramic sheet (4) were stacked together; graphite punches (11) and (12) were placed on the top and bottom of the stacked product of the metal sheets (2) and (3) and the ceramic sheet (4); and electrodes (13) and (14) were brought into electrical contact with the top surface of the upper punch (11) and the bottom surface of the lower punch (12), respectively.

Subsequently, in a vacuum atmosphere (1 to 10 Pa), a pressure of 20 MPa was applied to both the top and bottom sides of the stacked product of the metal sheets (2) and (3) and the ceramic sheet (4) by means of the upper and lower punches (11) and (12), while voltage was applied between the electrodes (13) and (14).

However, no current flowed between the electrodes (13) and (14), and thus the temperature of the stacked product was not elevated. Therefore, the metal sheets (2) and (3) failed to be bonded to the ceramic sheet (4).

COMPARATIVE EXAMPLE 4

There was provided one AlN ceramic sheet (50) having dimensions of 34 mm in length, 28 mm in width, and 0.635 mm in thickness. The surfaces of the ceramic sheet (50) were subjected to degreasing treatment with an organic solvent. Both surfaces of the ceramic sheet have a surface roughness Ra of 0.8 μm.

In addition, there was provided Al powder (purity: 99 wt. %) having a mean particle size of 100 μm.

Figure 14:
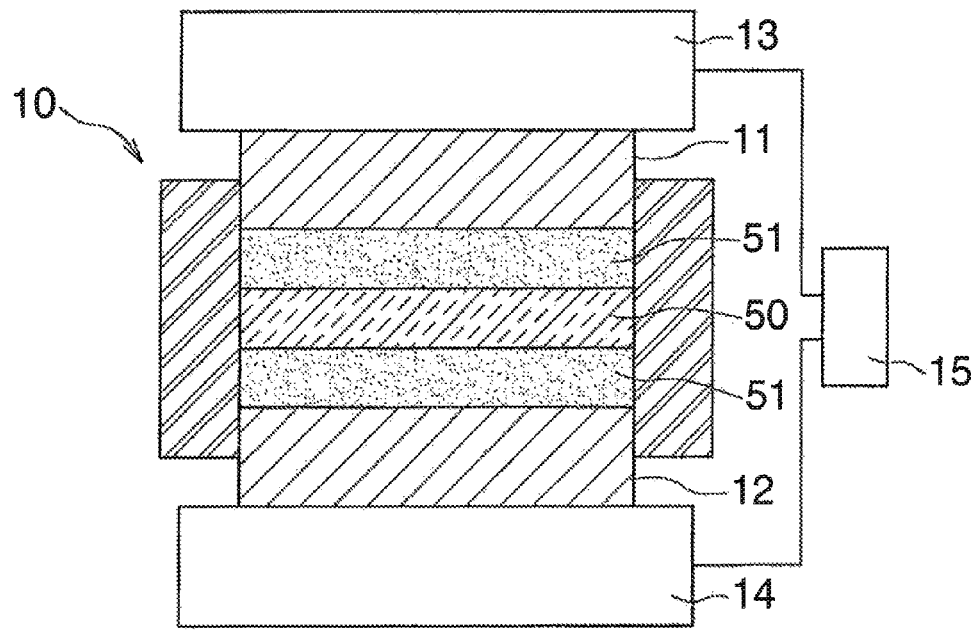
[FIG. 14]

Subsequently, as shown in FIG. 14, the ceramic sheet (50) was placed in a graphite sintering die (10), and the Al powder (51) was placed on both the top and bottom surfaces of the ceramic sheet (50) in the die (10). Then, graphite punches (11) and (12) were placed on the top and bottom of the product of the ceramic sheet (50) and the Al powder (51) in the die (10), and electrodes (13) and (14) were brought into electrical contact with the top surface of the upper punch (11) and the bottom surface of the lower punch (12), respectively.

Subsequently, in a vacuum atmosphere (1 to 10 Pa), a pressure of 20 MPa was applied to both the top and bottom sides of the product of the ceramic sheet (50) and the Al powder (51) by means of the upper and lower punches (11) and (12), while a pulse current (maximum: 2,000 A) was applied between the electrodes (13) and (14), to thereby heat the ceramic sheet (50) and the Al powder (51) to 550° C. over 15 minutes, followed by retention at 550° C. for five minutes. Thus, the Al powder (51) was sintered into a compact through spark plasma sintering, and the sintered compact was bonded to both surfaces of the ceramic sheet (50). Thereafter, application of current between the electrodes (13) and (14) was stopped, followed by cooling, to thereby produce a layered material having a three-layer structure.

The flatness of both surfaces of the thus-produced layered material was measured and found to be 123 μm, which is at such a level that a sizing process (e.g., polishing) is required. The bulk density of the thus-produced layered material was found to be 99.0% of the true density thereof. The layered material exhibited poor quality, due to high porosity of the sintered compact, and the presence of defects therein.

EXAMPLE 10

In Example 10, the layered material (1) according to Embodiment 1 was produced.

There were provided one metal sheet (2) formed of Al (purity: 99.9 wt. %) and having dimensions of 34 mm in length, 28 mm in width, and 0.6 mm in thickness; one metal sheet (3) formed of an Al—Si alloy (Si content: 10 wt. %, amounts of Al and inevitable impurities: balance) and having dimensions of 34 mm in length, 28 mm in width, and 1.0 mm in thickness; and one ceramic sheet (4) formed of AlN (containing $Y_2O_3$ in an amount of about 5 wt. %) and having dimensions of 34 mm in length, 28 mm in width, and 0.635 mm in thickness. The surfaces of the metal sheets (2) and (3) and the ceramic sheet (4) were subjected to degreasing treatment with an organic solvent. Treatment for removal of oxide film was not carried out. Both surfaces of each of the metal sheets (2) and (3) have a surface roughness Ra of 0.3 μm, and both surfaces of the ceramic sheet (4) have a surface roughness Ra of 0.8 μm.

Subsequently, the metal sheets (2) and (3) and the ceramic sheet (4) were stacked and placed in a sintering die (10) as shown in FIG. 2 so that the ceramic sheet (4) was disposed between the metal sheets (2) and (3). Graphite punches (11) and (12) were placed on the top and bottom of the stacked product of the metal sheets (2) and (3) and the ceramic sheet (4) in the die (10), and electrodes (13) and (14) were brought into contact with the top surface of the upper punch (11) and the bottom surface of the lower punch (12), respectively.

Then, in a vacuum atmosphere (1 to 10 Pa), a pressure of 20 MPa was applied to both the top and bottom sides of the stacked product of the metal sheets (2) and (3) and the ceramic sheet (4) by means of the upper and lower punches (11) and (12), while a pulse current (maximum: 2,000 A) was applied between the electrodes (13) and (14), to thereby heat the metal sheets (2) and (3) and the ceramic sheet (4) to 540° C. over 10 minutes. The stacked product was maintained at 540° C. for three minutes, to thereby bond the metal sheets (2) and (3) to the ceramic sheet (4). The heating temperature 540° C. for bonding corresponds to a temperature between 510° C., which is lower by 150° C. than the melting point (660° C.) of Al (purity: 99.9 wt. %) forming the metal sheet (2), and 567° C., which is lower by 10° C. than the melting point (577° C.) of the Al—Si alloy forming the metal sheet (3). Thereafter, application of current between the electrodes (13) and (14) was stopped, followed by cooling, to thereby produce the layered material (1) having a three-layer structure.

A cross section of the thus-produced layered material (1) was observed for confirming the state of the bonding interfaces.

Figure 15:
[FIG. 15]
Figure 16:
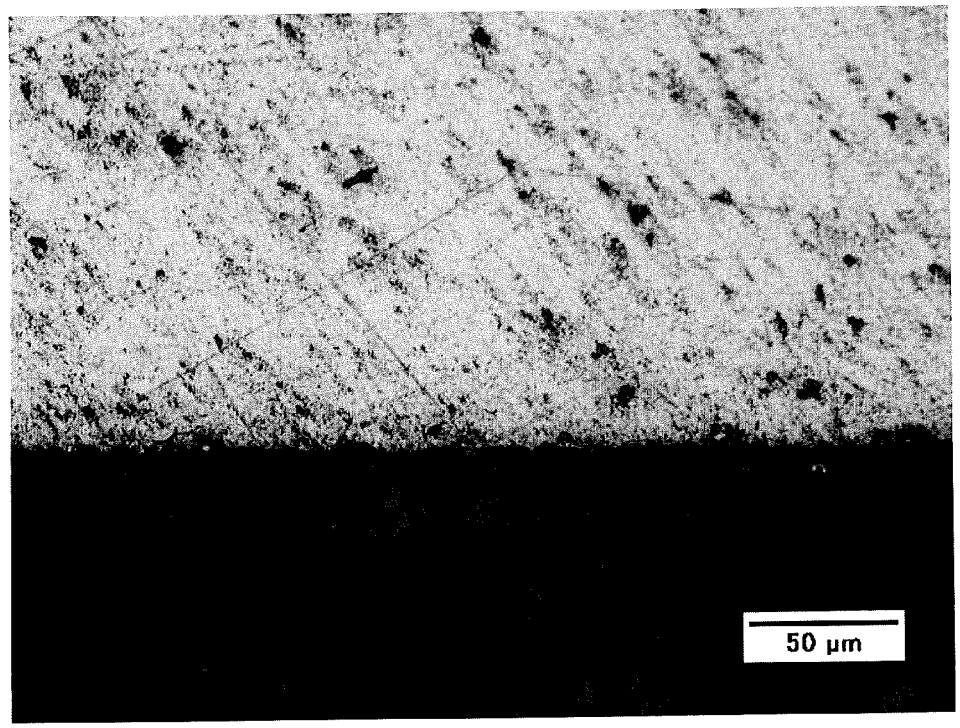
[FIG. 16]
Figure 17:
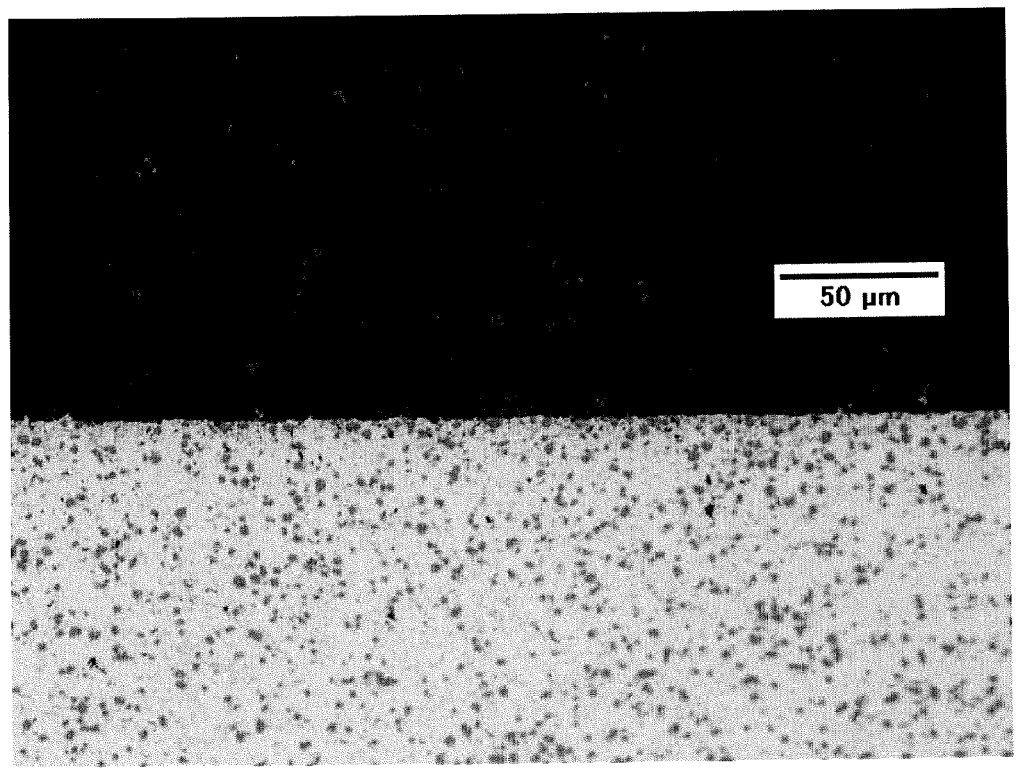
[FIG. 17]

The results are shown in FIGS. 15 to 17. As is clear from FIGS. 15 to 17, the Al metal sheet is reliably bonded to the ceramic sheet, and the Al—Si alloy metal sheet is also reliably bonded to the ceramic sheet.

Industrial Applicability

The layered material of the present invention is suitably employed for cooling of a semiconductor device such as a power device.

The invention claimed is:

1. A method for producing a layered material,
    wherein the layered material comprises two metal sheets, one ceramic sheet, and at least one additional metal sheet which is made of a material which does not melt at a heating temperature during spark plasma sintering,
    wherein a difference in melting temperature between the two metal sheets is 140° C. or less, wherein the metal sheets and the ceramic sheet are stacked together such that the ceramic sheet is adjacent to each of the metal sheets, and the ceramic sheet is bonded to the adjacent metal sheets through spark plasma sintering,
    wherein the method is characterized by comprising:
    stacking two metal sheets on both surfaces of the ceramic sheet so that the ceramic sheet is adjacent to each of the metal sheets and stacking the additional metal sheet on the surface of at least one of the two metal sheets on the side opposite the surface which is in contact with the ceramic sheet:
    disposing the stacked product of the metal sheets, the ceramic sheet, and the additional metal sheet between a pair of electrodes for spark plasma sintering; and
    applying pulse current between the electrodes while securing electrical conduction between the electrodes and heating at a temperature between the temperature lower by 150° C. than the melting temperature of the higher-melting-temperature metal sheet of the two metal sheets, and the temperature lower by 10° C. than the melting temperature of the lower-melting-temperature metal sheet of the two metal sheets, to thereby bond the two metal sheets to both surfaces of the ceramic sheet, and bond the additional metal sheet to the surface of at least one of the two metal sheets on the side opposite the surface bonded to the ceramic sheet.

2. A method for producing a layered material according to claim 1, wherein the metal sheets and the additional metal sheet(s) are formed of one material selected from the group consisting of Al, Cu, Ag, Au, Ni, Ti, an Al alloy, a Cu alloy, an Ag alloy, an Au alloy, an Ni alloy, and a Ti alloy.

3. A method for producing a layered material according to claim 1, wherein the ceramic sheet is formed of one material selected from the group consisting of AlN, $Al_2O_3$, $Si_3N_4$, SiC, $Y_2O_3$, CaO, BN, and BeO.

4. A method for producing a layered material according to claim 1, wherein the arithmetic mean surface roughness (Ra) of the metal sheets and the additional metal sheet(s) is 1.0 µm or less.

5. A method for producing a layered material according to claim 1, wherein the arithmetic mean surface roughness (Ra) of the ceramic sheet is 1.5 µm or less.

6. A method for producing a layered material according to claim 1, wherein bonding between the metal sheets and the ceramic sheet by applying pulse current between the electrodes is carried out through application of a pressure of 10 to 100 MPa to both sides of the stacked product of the metal sheets and the ceramic sheet in a stacking direction.

7. A method for producing a layered material according to claim 1, wherein bonding between the metal sheets and the ceramic sheet by applying pulse current between the electrodes is carried out in an inert gas or vacuum atmosphere.

8. A method for producing a layered material,
wherein the layered material comprises one metal sheet, one or two ceramic sheets, and an additional metal sheet made of a material which does not melt at a heating temperature during spark plasma sintering,
stacking one metal sheet and one ceramic sheet together so that the metal sheet is adjacent to the ceramic sheet(s), and stacking the additional metal sheet on a surface of the metal sheet on a side opposite a surface which is in contact with the ceramic sheet;
disposing the stacked product of the metal sheet, the ceramic sheet, and the additional metal sheet between a pair of electrodes for spark plasma sintering; and
applying pulse current between the electrodes while securing electrical conduction between the electrodes and heating at a temperature lower by 10 to 150° C. than the melting temperature of the metal sheet, to thereby bond the metal sheet to the ceramic sheet adjacent thereto; and
wherein one metal sheet is stacked on one surface of one ceramic sheet; an additional metal sheet made of a material which does not melt at the heating temperature during spark plasma sintering is stacked on the surface of the metal sheet on the side opposite the surface which is in contact with the ceramic sheet; and the metal sheet is bonded to one surface of the ceramic sheet, while the additional metal sheet made of a material which does not melt at the heating temperature during spark plasma sintering is bonded to the surface of the metal sheet on the side opposite the surface bonded to the ceramic sheet.

9. A method for producing a layered material according to claim 8, wherein the metal sheet and the additional metal sheet are formed of one material selected from the group consisting of Al, Cu, Ag, Au, Ni, Ti, an Al alloy, a Cu alloy, an Ag alloy, an Au alloy, an Ni alloy, and a Ti alloy.

10. A method for producing a layered material according to claim 8, wherein the ceramic sheet is formed of one material selected from the group consisting of AlN, $Al_2O_3$, $Si_3N_4$, SiC, $Y_2O_3$, CaO, BN, and BeO.

11. A method for producing a layered material according to claim 8, wherein the arithmetic mean surface roughness (Ra) of the metal sheet and the additional metal sheet is 1.0 µm or less.

12. A method for producing a layered material according to claim 8, wherein the arithmetic mean surface roughness (Ra) of the ceramic sheet is 1.5 µm or less.

13. A method for producing a layered material according to claim 8, wherein bonding between the metal sheet and the ceramic sheet by applying pulse current between the electrodes is carried out through application of a pressure of 10 to 100 MPa to both sides of the stacked product of the metal sheet and the ceramic sheet in a stacking direction.

14. A method for producing a layered material according to claim 8, wherein bonding between the metal sheet and the ceramic sheet by applying pulse current between the electrodes is carried out in an inert gas or vacuum atmosphere.

* * * * *